US010701842B2

(12) United States Patent
Ide et al.

(10) Patent No.: US 10,701,842 B2
(45) Date of Patent: Jun. 30, 2020

(54) POWER CONVERTER HAVING WATER PASSAGES FOR COOLING POWER MODULES

(71) Applicant: HITACHI, LTD., Tokyo (JP)

(72) Inventors: Eiichi Ide, Tokyo (JP); Akitoyo Konno, Tokyo (JP); Shinji Sugimoto, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 258 days.

(21) Appl. No.: 15/576,523

(22) PCT Filed: May 27, 2015

(86) PCT No.: PCT/JP2015/065155
§ 371 (c)(1),
(2) Date: Nov. 22, 2017

(87) PCT Pub. No.: WO2016/189674
PCT Pub. Date: Dec. 1, 2016

(65) Prior Publication Data
US 2018/0146577 A1   May 24, 2018

(51) Int. Cl.
*H02K 7/20* (2006.01)
*H05K 7/20* (2006.01)
(Continued)

(52) U.S. Cl.
CPC .......... *H05K 7/20927* (2013.01); *H02K 9/19* (2013.01); *H02K 11/33* (2016.01); *H02M 7/003* (2013.01);
(Continued)

(58) Field of Classification Search
CPC .......... H02K 9/19; H02K 9/193; H02K 11/33; H02M 1/08; H02M 7/003; H02M 7/5395;
(Continued)

(56) References Cited

U.S. PATENT DOCUMENTS 8,462,529 B2 * 6/2013 Ward .................... B60L 3/003
363/131
2004/0183385 A1   9/2004 Takahashi et al.
(Continued)

FOREIGN PATENT DOCUMENTS

CN   102460912 A   5/2012
CN   102570694 A   7/2012
(Continued)

OTHER PUBLICATIONS

International Search Report for WO 2016/189674 A1, dated Sep. 1, 2015.

*Primary Examiner* — Alfonso Perez Borroto
*Assistant Examiner* — Rashad H Johnson
(74) *Attorney, Agent, or Firm* — Volpe and Koenig, P.C.

(57) ABSTRACT

An object of the invention is to provide a power converter that can be reduced in size. To achieve this, a power converter according to the invention includes: water passages arranged radially from an assumed central axis, each being trapezoid-shaped in cross section; and power modules placed between the water passages such that each of the power modules is sandwiched from both surfaces thereof by the water passages. Each of the power modules has an output terminal and positive and negative terminals on an end face located in a centrifugal direction side with respect to the assumed central axis. Any of the power modules and an adjacent one of the power modules are set in a front-back inverted manner.

13 Claims, 14 Drawing Sheets

(51) Int. Cl.
*H02M 7/21* (2006.01)
*H02M 7/217* (2006.01)
*H02K 11/33* (2016.01)
*H02K 9/19* (2006.01)
*H02M 7/00* (2006.01)
*H02M 1/08* (2006.01)
*H02M 7/5395* (2006.01)
*H02P 27/08* (2006.01)

(52) U.S. Cl.
CPC ............. *H02M 7/21* (2013.01); *H02M 7/217* (2013.01); *H05K 7/20272* (2013.01); *H02M 1/08* (2013.01); *H02M 7/5395* (2013.01); *H02P 27/08* (2013.01)

(58) Field of Classification Search
CPC . H02P 27/08; H05K 7/20272; H05K 7/20927
USPC ............................ 310/54, 57, 58, 63, 64, 71
See application file for complete search history.

(56) References Cited

U.S. PATENT DOCUMENTS

| | | | |
|---|---|---|---|
| 2004/0189114 A1* | 9/2004 | Iwashima | H02K 11/33 310/68 D |
| 2009/0114462 A1* | 5/2009 | Tahara | B60K 11/04 180/65.21 |
| 2009/0206662 A1* | 8/2009 | Kakuda | B60K 6/365 307/11 |
| 2011/0018374 A1 | 1/2011 | Yamasaki et al. | |
| 2012/0098361 A1 | 4/2012 | Yamasaki et al. | |
| 2012/0098365 A1 | 4/2012 | Yamasaki et al. | |
| 2012/0098391 A1 | 4/2012 | Yamasaki et al. | |
| 2012/0098366 A1 | 5/2012 | Yamasaki et al. | |
| 2012/0104886 A1 | 5/2012 | Yamasaki et al. | |
| 2012/0300521 A1* | 11/2012 | Hida | H05K 7/1432 363/131 |
| 2014/0311716 A1* | 10/2014 | Yamada | H02K 11/215 165/121 |
| 2017/0069562 A1* | 3/2017 | Ide | H01L 23/528 |
| 2017/0084515 A1* | 3/2017 | Shintani | H01L 23/427 |
| 2018/0013355 A1* | 1/2018 | Tokuyama | H01L 23/48 |
| 2018/0146577 A1* | 5/2018 | Ide | H02K 11/33 |
| 2018/0152114 A1* | 5/2018 | Chun | H02M 7/003 |
| 2018/0159403 A1* | 6/2018 | Yokoyama | H02K 5/20 |

FOREIGN PATENT DOCUMENTS

| | | |
|---|---|---|
| CN | 102804558 A | 11/2012 |
| CN | 102804559 A | 11/2012 |
| CN | 102804560 A | 11/2012 |
| DE | 102010017519 A1 | 1/2011 |
| EP | 1463183 A2 | 9/2004 |
| JP | 05-025988 U | 4/1993 |
| JP | 2004-282905 A | 10/2004 |
| JP | 2004-297846 A | 10/2004 |
| JP | 2011-030405 A | 2/2011 |
| JP | 2011-176998 A | 9/2011 |
| JP | 2011-176999 A | 9/2011 |
| JP | 2011-177000 A | 9/2011 |
| JP | 2011-177001 A | 9/2011 |
| JP | 2014-057514 A | 3/2014 |
| JP | 2014-171342 A | 9/2014 |
| WO | 20100150527 A1 | 12/2010 |
| WO | 20100150528 A1 | 12/2010 |
| WO | 20100150529 A1 | 12/2010 |
| WO | 20100150530 A1 | 12/2010 |

* cited by examiner

POWER CONVERTER HAVING WATER PASSAGES FOR COOLING POWER MODULES

TECHNICAL FIELD

The present invention relates to a power converter with double-side cooled power modules.

BACKGROUND ART

In recent years, for power saving, high-efficiency power converters that utilize the switching of semiconductor devices called power semiconductor chips have been used widely in the fields of automobiles, railroads, industrial equipment, and power equipment. Power semiconductor chips release large amounts of heat when electric current is applied and thus need to be cooled. They are used in the form of power modules in which electrically conductive materials, heat dissipating materials, and insulating materials associated with them are installed, and there is a demand for size reduction of such modules.

As structures for achieving the size reduction of power modules, double-side cooled power module structures, which are cooled from both sides of a power semiconductor chip, have been proposed for electric vehicles.

Patent Document 1 discloses a structure in which, for achieving low inductance and low loss, parallelized double-side cooled power modules and capacitors are bonded to positive and negative busbars that are in the form of a laminated layer. Patent Document 2 discloses a structure in which parallelized double-side cooled power modules are arranged in the form of a circle. Patent Document 3 discloses a structure in which power modules and air-cooling fins are arranged around a circle and they are placed next to a side surface of a motor.

PRIOR ART DOCUMENTS

Patent Documents

Patent Document 1: JP-2014-171342-A
Patent Document 2: JP-2004-282905-A
Patent Document 3: JP-05-025988-U

SUMMARY OF THE INVENTION

Problem to be Solved by the Invention

In a structure in which double-side cooled power modules are placed along a straight line such that they face each other as in Patent Documents 1 and 2, size reduction of the power converter is difficult to achieve because insulation distances (clearance and creepage distances) need to be secured between the terminals of the power modules, for which sealing with the use of an insulating material is difficult.

When one-side cooled power modules are placed in the form of a circle and the terminals are placed on the outer circumferential side as in Patent Document 3, the installation space of air-cooling fins becomes smaller. Thus, further improvements in cooling efficiency were expected. However, it is impossible to achieve sufficient cooling efficiency. Also, if air-cooling fins are placed such that cooling air is necessary for a direction normal to the circumference, placing the power converter on a lateral surface of the motor increases the lateral size of the whole structure.

As above, while double-side cooled power modules are being reduced in size due to high cooling performance, size reduction of capacitors are difficult to achieve, and power converters may be increased in size, constrained by the installation structure of capacitors.

When power converters are applied to high-voltage systems such as railroads, the international standard IEC60077-1 stipulates that the insulation distance between terminals in which a voltage difference exists needs to be 10 mm or longer. Further, if the necessary capacitor capacitance is larger than a low-voltage system and constrained by the insulation distances at the terminal sections and by the volume of the capacitors, the size of the power converter has to be increased.

In view of the above, an object of the invention is to provide a power converter that can be reduced in size.

Means for Solving the Problem

To achieve the above object, a power converter according to the invention includes: water passages arranged radially from an assumed central axis, each being trapezoid-shaped in cross section; and power modules placed between the water passages such that each of the power modules is sandwiched from both surfaces thereof by the water passages. Each of the power modules has an output terminal and positive and negative terminals on an end face located in a centrifugal direction side with respect to the assumed central axis. Any of the power modules and an adjacent one of the power modules are set in a front-back inverted manner.

Effect of the Invention

In accordance with the invention, power converters can be reduced in size.

MODES FOR CARRYING OUT THE INVENTION

Embodiment 1

Power modules according to an embodiment of the invention will now be described with reference to FIGS. 1 through 5. In the accompanying drawings and the embodiments that follow, we use IGBTs (insulated gate bipolar transistors) as the power modules. It should be noted however that the invention is also applicable to MOSFETs.

Figure 1:
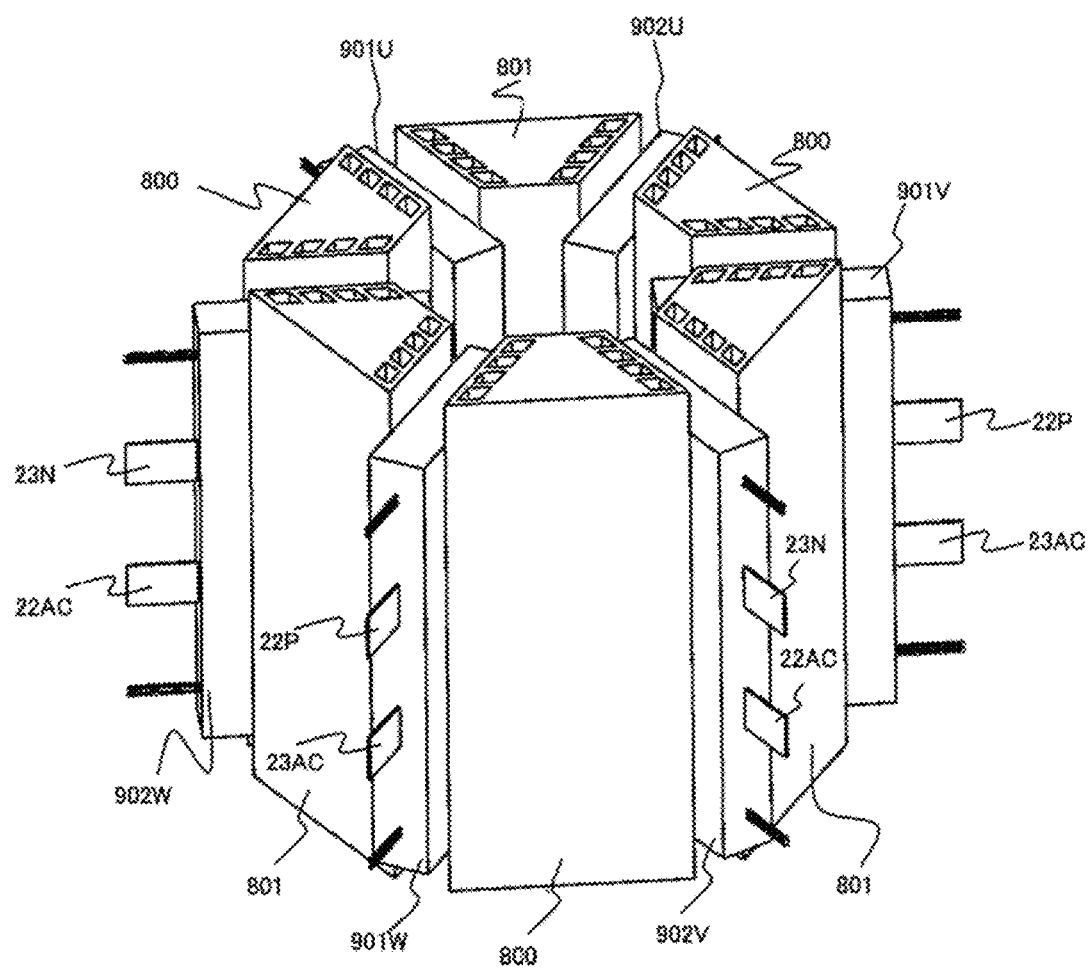
FIG. 1 is a perspective view illustrating the external appearance of power modules and coolers according to an example of the invention.
Figure 2:
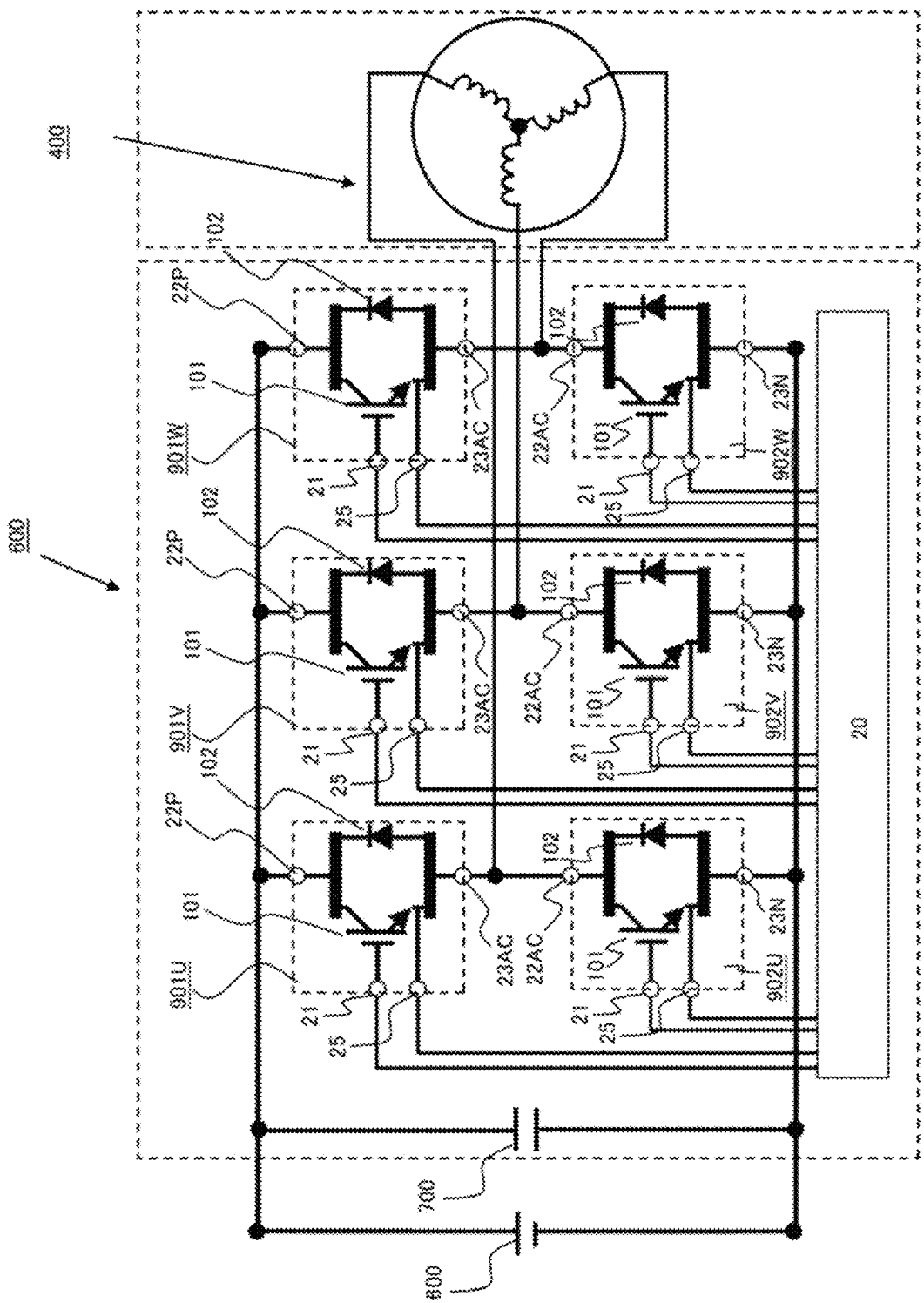
FIG. 2 is a circuit diagram of a power converter according to an example of the invention.

FIG. 1 is a perspective view of a power converter according to the invention, and FIG. 2 illustrates an inverter circuit according to the invention. The power converter includes multiple water passages arranged radially from an assumed central axis, each being trapezoid-shaped in cross section. The power converter also includes power modules placed between the water passages such that each module is sandwiched between the water passages. In other words, the power modules, 901U, 901V, and 901W, which are cuboid-shaped, and the water passages, 800 and 801, which are trapezoid-shaped in cross section, are arranged in the form of a circle.

Such circular arrangement of the power modules and the water passages leads to a substantially cylinder shape of the whole structure; thus, a small-sized power converter can be achieved. In addition, because the coolers of the power modules are used as the water passages, the cooler require less space than in the case of air-cooling fins. Thus, the water passages and the power modules 901 and 902 can be arranged along a circle without being constrained by the size of the coolers. Moreover, with the trapezoidal shape of the water passages 800 and 801, variations in the thickness of the power modules 901 and 902 are tolerable, which leads to higher productivity. Furthermore, the high-cooling-efficiency fin sections are made wider than the radiating surfaces of the power modules 901 and 902 and can thus be arranged without affecting cooling performance even in the case of displacement.

As illustrated in FIG. 2, each of the power modules 901U, 901V, and 901W includes a 1-in-1 circuit for the upper arm of its phase. The power converter, which has three phases of U, V, and W phases, includes a capacitor 700 for smoothing a DC power supply; IGBTs 101 or switching elements; and diodes 102. If the IGBTs or switching elements are instead MOSFETs, the parasitic diodes of the MOSFETs can be used without connecting the diodes 102 thereto. The switching elements 101 are turned on or off by their control terminals receiving the gate voltage corresponding to an on or off signal from a gate drive circuit 20. On and off signals are controlled by, for example, PWM (pulse width modulation). The power modules 902U, 902V, and 902W include 1-in-1 circuits for the lower arms of their respective phases, as illustrated in FIG. 2.

Figure 3:
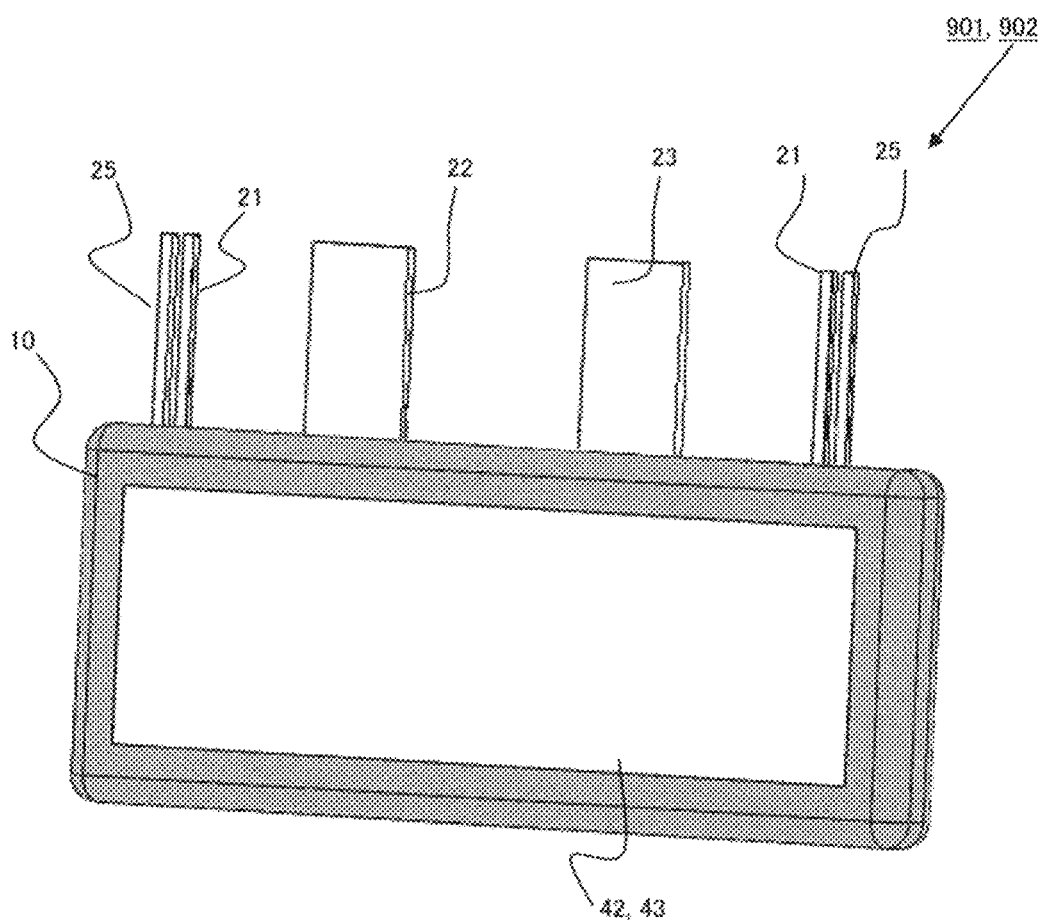
FIG. 3 is a perspective view of a power module according to an example of the invention.

Each of the power modules includes positive and negative terminals and output terminals on the end face located in a centrifugal direction side with respect to the assumed central axis. FIG. 3 is a perspective view of one of the power modules 901 and 902. The gate terminal 21 and sense emitter terminal 25 of its control terminal and the emitter terminal 22 and collector terminal 23 of its power terminal protrude from one of the end faces lying in a traverse direction. Referring to FIG. 1, the emitter terminals 22 of the power modules 901U, 901V, and 901W function as positive terminals 22P while their collector terminals 23 function as output terminals 23AC. The power modules placed between the power modules 901U, 901V, and 901W are arranged in a front-back inverted manner such that the emitter terminals 22 of the power modules 902U, 902V, and 902W function as output terminals 22AC while their collector terminals 23 function as negative terminals 23N. All the terminals are aligned on the end faces located in a centrifugal direction side with respect to the assumed central axis of the power converter, and the insulation distances (clearance and creepage distances) meeting standards are achieved. Although not illustrated, a first insulating material 10 has concave and convex portions so that the creepage distances can be ensured. As above, the positive or negative terminals are placed in an area in which they do not interfere with the output terminals.

By drawing the positive and negative terminals 22P and 23N and output terminals 22AC and 23AC of the power modules, for which the insulation distances are required, from a direction of the outer circumference of the lateral surfaces of the substantially cylindrical structure, it is possible to make the installation space of the power module section smaller than when the power modules and the water passages are aligned along a straight line. Also, by allowing the power modules 901 and 902 of the upper and lower arms to have the same shape and making the emitter terminals and the collector terminals laterally symmetrical when the power modules are front-back inverted, it is possible to install the positive and negative terminals and the output terminals substantially at the same height and easily lead the capacitor terminal and the output terminals. Further, power modules of the same shape can be used, which in turn leads to improved productivity.

Furthermore, in FIG. 1, (the surface) of the power module (on which the terminals are provided) protrude more than the water passages in a centrifugal direction with respect to the assumed central axis. In other words, the terminal side of the power modules 901 and 902 protrudes more than the water passages 800 and 801 in a radially outward direction, and the insulation distances (clearance and creepage distances) meeting standards are ensured between the terminals and the water passages by the first insulating material 10. As above, as for the power module terminal side, by allowing the first insulating material 10 to protrude more than the water passages, the necessary insulation distances can be ensured between the terminals and the water passages.

The front radiating surface 42 and rear radiating surface 43 of the power modules 901 and 902 (not illustrated) are the radiating surfaces of the power modules 901 and 902. The first insulating material 10 covers the area that excludes the terminals 21, 22, 23, and 25, and the radiating surfaces 42 and 43. Also, the power modules 901 and 902 are attached in a pressed manner to the coolers 800 and 801 via thermally conductive sheets 134 (not illustrated).

Figure 4:
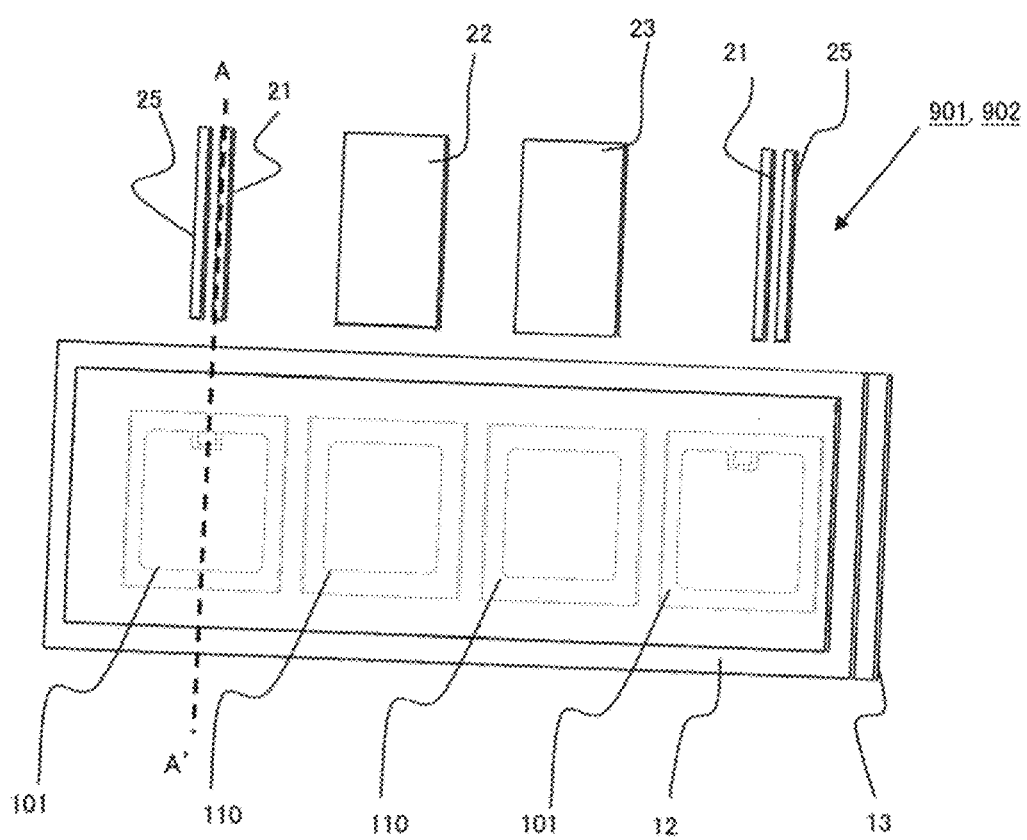
FIG. 4 is a perspective view of a power module from which a first insulating material according to an example of the invention has been removed.

FIG. 4 is obtained by removing the first insulating material 10 from FIG. 3. In the present embodiment, as the power semiconductor devices to be installed, two IGBTs 101 and two diodes 102 are provided. The two IGBTs 101 and the two diodes 102 are sandwiched between a ceramic substrate 12 on the emitter electrode side having circuit patterns and metalized layers on its both surfaces and a ceramic substrate 13 on the collector electrode side (shown to facilitate understanding). As for the number of IGBTs and diodes to be installed, it can be changed according to the rated current. In this specification, layers consisting of metal substrates having heat dissipating properties are referred to as metalized layers.

Figure 5:
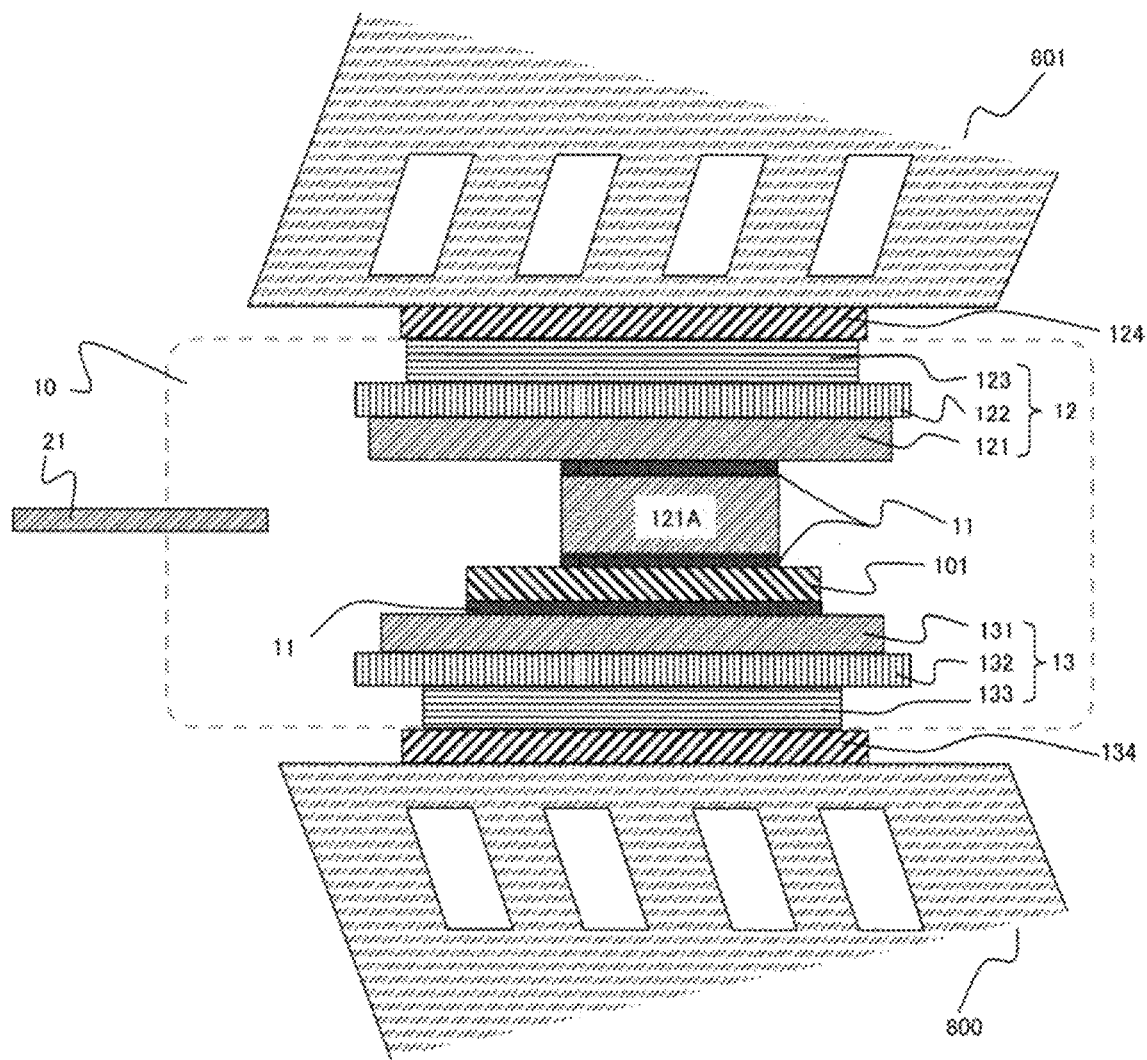
FIG. 5 is a cross section taken along line AA' of the power module of the invention.

FIG. 5 is a cross section taken along dotted line AA' of FIG. 4. The collector electrode of the IGBT 101 and the cathode of the diode 102 (not illustrated) are electrically bonded via a metal bonding section 11 to the collector circuit 131 provided on a ceramic substrate 13 having a metalized 133 and a ceramic insulating layer 132. The emitter electrode 102 of the IGBT 101 and the anode of the diode 102 (not illustrated) are electrically bonded via metal bonding sections 11 and a projection 121A to the emitter circuit 121 provided on a ceramic substrate 12 having a metalized layer 123 and a ceramic insulating layer 122.

Also, the radiating surfaces 42 and 43 are formed on the opposite side of the surfaces of the ceramic substrates 12 and 13 on which the IGBTs and diodes are installed. The heat generated at the active section of the IGBT 101 has two routes: one in which it is transferred vertically through the ceramic substrate 13 and cooled by the water passage 800; and one in which it is transferred vertically from the projection 121A through the ceramic substrate 12 and cooed by the water passage 801. We define a power module having front and back directions and two heat dissipating routes as a double-side cooled power module.

The projection 121A provided on the emitter circuit 121 has the function of controlling the insulation distance between the emitter circuit 121 and the collector circuit 131 determined by the insulation characteristics of the first insulating material 10. The width and depth of the projection 121A are higher than its thickness so that it can be independent during the bonding process. Next, the thickness of the projection 121A is made larger than those of the metal bonding sections 11 so that variations in tilt and thickness during bonding can be smaller. Also, to facilitate assembly, the width and depth of the installation surface of the projection 121A that comes into contact with the emitter electrode 102 are made smaller than the emitter electrode 102.

It is preferred to select, for the projection 121A, highly thermally conductive copper, aluminum, molybdenum, tungsten, carbon, their alloy, or composite material so that it can be low in electric and thermal resistance. It is also possible to combine these to provide an intermediate layer with low thermal expansion for copper or aluminum. In the present embodiment, the intermediate layer is not used.

Similar to Embodiment 1, for the ceramic insulating layers 122 and 132, aluminum nitride, silicon nitride, alumina or the like, which are high in dielectric voltage, are used. Especially, aluminum nitride and silicon nitride, which are high in thermal conductivity, are preferred. The thickness of the ceramic insulating layers 122 and 132 is set within the range of 0.1 to 1.5 mm according to the insulating properties required for the power modules. In this structure, the thicknesses of the front- and back-side ceramic insulating layers are made equal to lessen the deformation of the power modules due to thermal stress.

For the emitter circuit 121 and collector circuit 131 having the emitter electrode 102 and collector electrode 103, which are main electrodes of the IGBT 101, low electric resistance copper, aluminum, or their alloy is used. Between the circuits and the ceramic insulating layers low in thermal expansion, it is possible to provide intermediate layers formed of low-thermal-expansion, high-thermal-conductivity molybdenum, tungsten, carbon, or a composite material formed of one of these materials and copper or aluminum.

In the present embodiment, the intermediate layer is not used. The thicknesses of the emitter circuit 121 and the collector circuit 131 are set within the range of 0.2 to 2.0 mm according to the current capacity needed.

For the metalized layers 123 and 133, high-terminal-conductivity copper, aluminum, or their alloy is used. Similar to the circuit side, between the metalized layers and the ceramic insulating layers, it is possible to provide intermediate layers formed of low-thermal-expansion, high-thermal-conductivity molybdenum, tungsten, carbon, or a composite material formed of one of these materials and copper or aluminum. In the present embodiment, the intermediate layer is not used.

The circuits 121 and 131 and the metalized layers 123 and 133 are bonded with, for example, a soldering material which can achieve powerful bonding with the ceramic layers 122 and 132. At this time, it is preferred to equalize the difference in thermal expansion rate between the circuits and the metalized layers and the thermal stress calculated from the Young's modulus, with the ceramic insulating layers placed therebetween.

The first insulating material 10 can be formed of, for example, adhesive novolak-based, polyfunctional, biphenyl-based, or phenol-based epoxy resin, bismaleimide-triazine resin, or cyanate ester resin. A filler such as ceramics, gel, or rubber formed from $SiO_2$, $A_2O_3$, AlN, or BN is added to these resins, and the terminal expansion coefficient is made closer to 3 to 23 ppm/K, close to those of the IGBT and circuits 121 and 131, to reduce the difference in thermal expansion coefficient. Also, the Young's modulus is set within the range of 1 to several tens of GPa. By using a resin with such a thermal expansion coefficient and the Young's modulus, the thermal stress generated due to a temperature increase at the time of use is reduced considerably. As a result, the lifespans of the power modules can be extended.

Before sealing the first insulating material 10 with the use of the above resin, it is preferred to perform a treatment to improve the adhesive strength of the first insulating material 10 on the circuits, terminals, ceramic insulating layers, metalized layers, semiconductor chips, and metal bonding sections. An example of the treatment is forming a coating film such as polyamide-imide or polyimide.

The metal bonding sections 11 for bonding the emitter electrode 102 and the collector electrode 103 are formed of, for example, a low-temperature sintering bonding material such as soldering material, fine metal particles, and metal oxide particles. For the soldering material, it is possible to use solder with a melting point higher than the curing temperature of the first insulating material 10, whose main constituent is tin, bismuth, zinc, gold, aluminum, or the like. For the fine metal particles, it is possible to use silver or copper particles covered with a flocculation protective material, especially those from which a flocculation protective material can be detached at a low temperature close to solder. For the metal oxide particles, it is possible to use a metal oxide that can be reduced at a low temperature close to soldering materials such as silver oxide and copper oxide. When fine silver particles, fine copper particles, silver oxide, or copper oxide particles are used, the metal bonding sections are sintered sliver or copper layers. The bonding is performed with being heated at 250° C. to 350° C. under a hydrogen or inactive atmosphere.

The gate electrode of the IGBT and the gate terminal 21 is bonded by ultrasonic bonding with the use of a wire or ribbon formed of Al or Cu low in electric resistance (not illustrated).

For the thermally conductive sheets 124 and 134, a sheet-shaped material high in thermal conductivity is used. Also, a material the Young's modulus of which is lower than those of the metalized layer 133 and the first insulating material 10 is used. Especially, electrically conductive metal or carbon sheets high in terminal conductivity are preferred in terms of thermal conductivity. Further, it is possible to add a carbon filler to acrylic, silicone, or urethane resin to achieve a flexible structure. Moreover, by exposing the surfaces of the metalized layers 123 and 133 and adopting an installation structure in which the thermally conductive sheets 124 and 134 are pressed against the metalized layers and the coolers without using chemical or metal bonding, it is possible to reduce the stress generated at the sheets.

It is possible to improve insulation properties by providing a second insulating material 602 between the first insulating material provided at the periphery of the thermally conductive sheets 124 and 134 and the water passages. As for the second insulating material 602, too, by adopting an installation structure in which the second insulating material 602 is pressed for tight contact without using chemical or metal bonding, it is possible to reduce the stress generated at the second insulating material 602. It is preferred that the Young's modulus of the second insulating material 602 be smaller than those of the first insulating material 10 and thermally conductive sheet 134. Examples of the material include, in addition to acrylic, silicone, or urethane resin, thermoplastic elastomer and silicone gel. The Young's modulus is preferably smaller than 1 MPa. By making it sufficiently softer than the thermally conductive sheets as above, if a supply thickness greater than those of the thermally conductive sheets is set, the second insulating material is compressed at the time of pressing until a sufficient pressing force is generated on the thermally conductive sheets.

For the water passages, it is preferred to use aluminum, copper, or their alloy, which are high in thermal conductivity, and they can be made by casting, forging, or machining. Especially, if aluminum or aluminum alloy is used and the extrusion method is used, the costs can be reduced. Also, series or parallel routes along which cooling water flows can be formed by joint sections.

It is preferred that the water passages have a water inlet provided on the collector circuit side of a power module and a water outlet provided on the emitter circuit side of the power module and that the cooling water flow from the collector circuit side to the emitter circuit side. In other words, it is preferred to introduce the cooling water from a water passage 800 that cools the collector surfaces of the power modules 901 and 902 and extract it from a water passage 801 that cools the emitter surfaces of the power modules 901 and 902. As illustrated in FIG. 5, the area of the collector electrode 103 is larger than that of the emitter electrode 102 close to the heat source of the IGBT 101. As a result, the collector side is smaller in thermal resistance and higher in the amount of heat transferred. Thus, the difference in temperature increase between the both surfaces of the power modules 901 and 902 can be made smaller by putting the water in the water passage 800 to be cooled and extracting it from the water passage 801. The joint sections of the water passages 800 and 801 can be made smaller in size by installing each joint between two adjacent water passages 800 and 801 than by installing it between two water passages 800 and 801 in a symmetrical surface direction.

Modification of Embodiment 1

A modification of Embodiment 1 is described with reference to FIG. 6.

Figure 6:
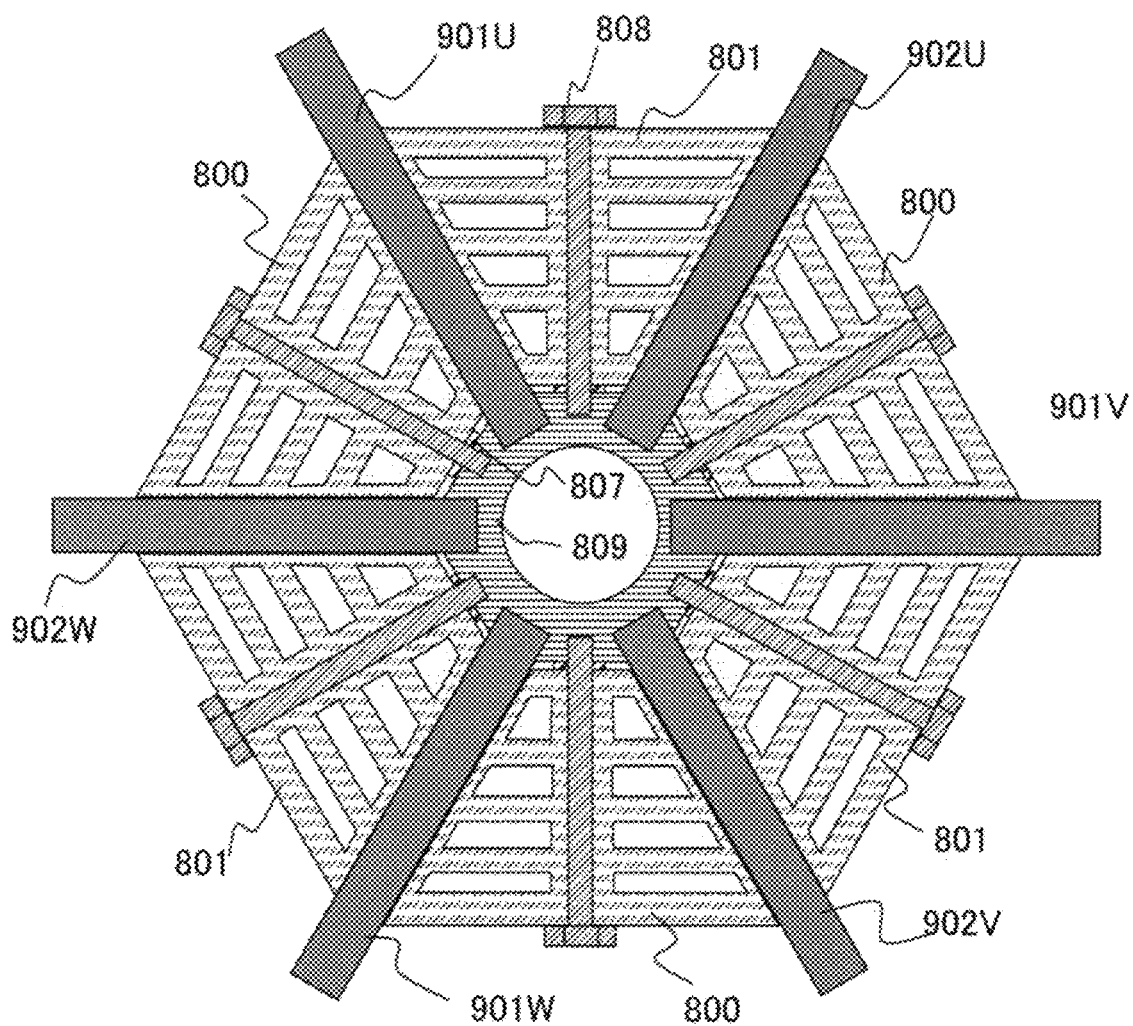
FIG. 6 is a schematic cross section of power modules and coolers according to a modification of the invention.

FIG. 6 is a cross section of the assembly of the power modules 901U, 901V, 901W, 902U, 902V, 902W and the water passages 800 and 801. The power converter of FIG. 6 includes a power module position setting section 809 around the assumed central axis. Each of the water passages 800 and 801 has cooling fins on the sides of the power modules 901 and 902 and a thick portion in the middle. A screw hole is provided in the thick portion, and the thick portion is fastened via a disk spring 807 to the module position setting section 809 with the use of a screw 808.

The module position setting section 809 has concave sections (engaging sections) to which the modules can be fixed temporarily, and by moving the water passages toward the center and applying a predetermined torque, a predetermined surface pressure can be applied to the power modules 901U, 901V, 901W, 902U, 902V, and 902W.

The engaging sections of the module position setting unit 809 that allows temporary fixation are not limited to the concave sections but can instead be convex sections. When the engaging sections are convex sections, concave sections can be provided on the modules for temporary fixation. Also, dot-shaped projections are possible. As to fixation methods, wedges or springs can also be used in addition to screws. Further, it is also possible to divide each of the water passages 800 and 801 into two trapezoid-shaped water passages and insert a compression member therebetween. In that case, the same shape can be achieved with the extrusion method, leading to improved productivity.

Embodiment 2

An example of the connection structure of the power modules of the invention and capacitors is described with reference to FIGS. 7 and 8. In the following embodiment, the same components as those used in Embodiment 1 will not be described again.

Figure 7:
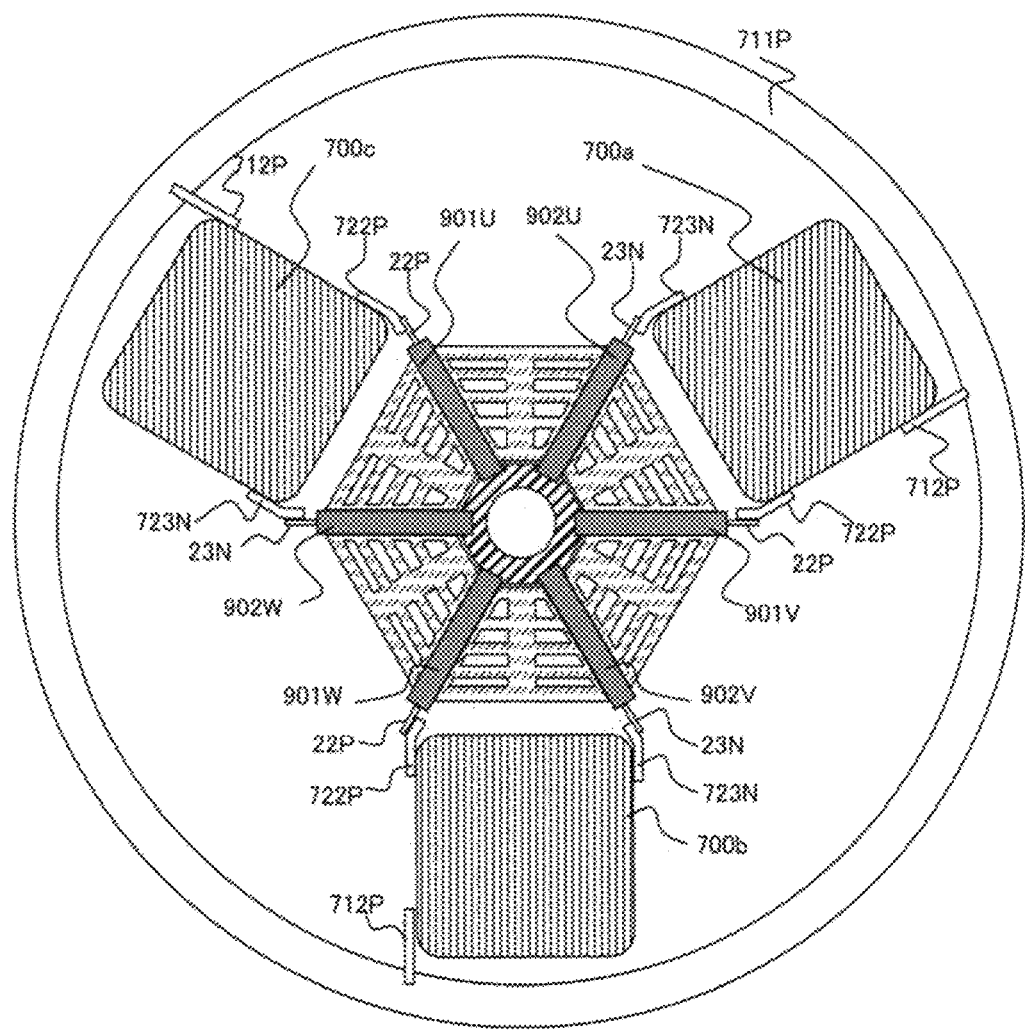
FIG. 7 is a cross section illustrating the assembly of power modules and coolers according to a modification of the invention.

FIG. 7 is a cross section of the assembly of the power modules 901U, 901V, 901W, 902U, 902V, and 902W, the water passages, capacitors 700a, 700b, and 700c according to the invention. The capacitors 700a to 700c can be electrolytic capacitors or film capacitors, or multiple capacitors can be housed in a single package. The capacitors are arranged radially from the assumed central axis such that each is placed next to one of the water passages. As above, in the present embodiment, the capacitors are placed closer to a centrifugal direction side with respect to the assumed central axis of the power converter than the power modules. By arranging the capacitors, large in volume, more outwardly than the power modules, the power converter can be reduced in size. Also, because the power modules 901U, 901V, 901W, 902U, 902V, and 902W and the capacitors 700a to 700c are arranged symmetrically, the lifespans of the capacitors 700a to 700c can be extended.

The positive terminal 722P of the capacitor 700a is connected to the positive terminal 22P terminal of the power module 901U constituting the U phase on the inner circumferential side with the necessary insulation distance secured. The negative terminal 723N of the capacitor 700a is connected to the negative terminal 23N terminal of the power module 902U on the inner circumferential side with the necessary insulation distance secured. Likewise, the capacitor 700b is connected to the positive terminal 22P terminal of the power module 901V and the negative terminal 23N terminal of the module 902V, and the capacitor 700c is connected to the positive terminal 22P terminal of the power module 901W and the negative terminal 23N terminal of the module 902W. By connecting the power modules and the capacitors as above, the distances between the capacitors and the power modules can be shortest, and loss can be minimized.

Positive terminals 712P are provided on the outer circumferential side of the capacitors 700a to 700c. The positive terminal 712P of each capacitor is electrically connected to a reflux busbar 711P. The reflux busbar is placed in a centrifugal direction side with respect to the assumed central axis of the power converter than the capacitors.

Figure 8:
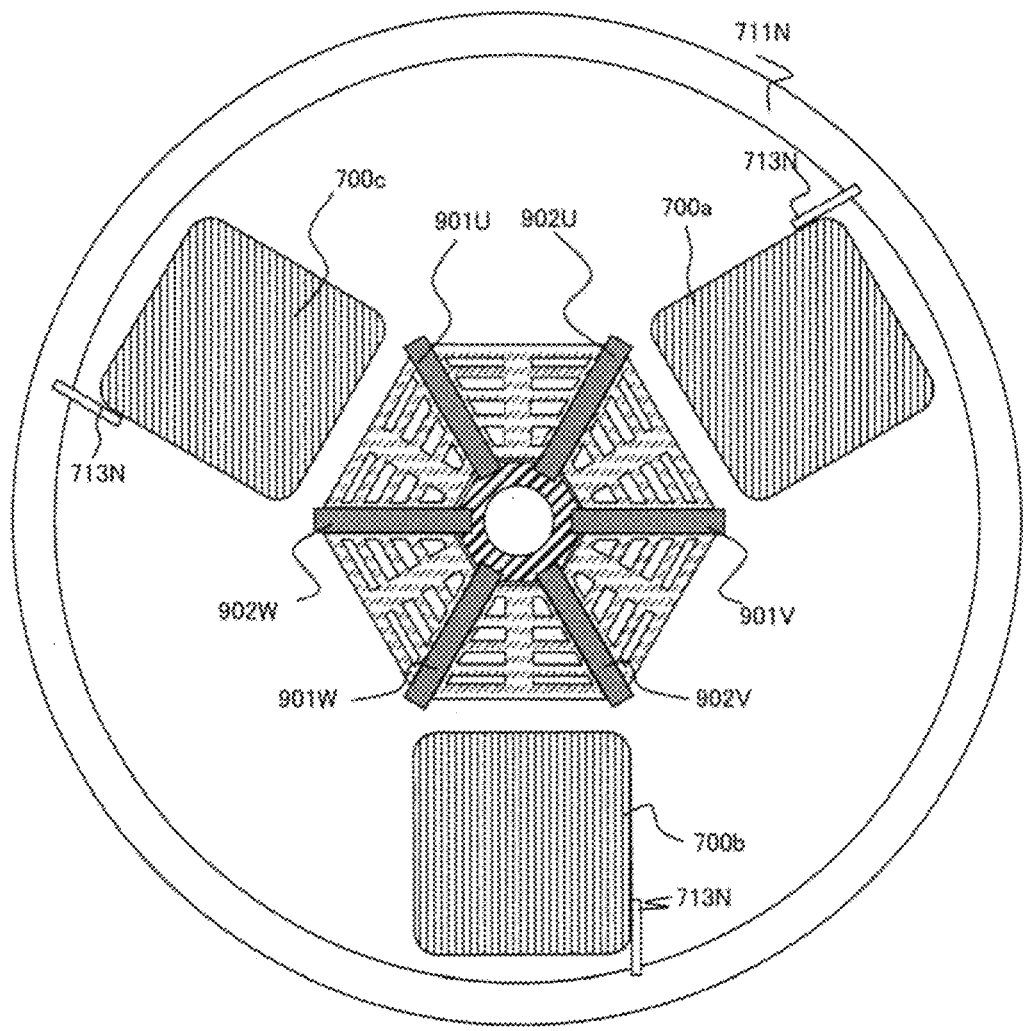
FIG. 8 is a schematic cross section of power modules and capacitors according to an example of the invention.

FIG. 8 is cross section illustrating the connection mode of the negative terminals 713N of the capacitors 700a to 700c and a reflux busbar 711N. The negative terminal 713N of each of the capacitors 700a to 700c is electrically connected to the reflux busbar 711N. Also, the reflux busbar 711N is installed such that it faces the reflux busbar 711P with the necessary insulation distance secured in a height direction. In FIG. 8, although they are made to face each other in a direction parallel to the drawing plane, they can face each other in a vertical direction. By such arrangement, low inductance can be achieved. Also, it is preferred to reduce the distance between the reflux busbars 711P and 711N, which are drawn-out sections, compared to the distance between the terminals 712P and 713N, by securing the necessary insulation distance by inserting insulation paper or a resin member or with the use of a resin mold.

By connecting each capacitor with the reflux busbars 711P and 711N, it is possible to reduce capacitor capacitance. Further, by placing the reflux busbars on the outside of the capacitors, the capacitors 700a to 700c can be supported by the reflux busbars 711P and 711N from the outer circumferential side, and the stress applied to the joint sections of the capacitors and the power modules can be reduced. Moreover, since the reflux busbars 711P and 711N are arranged in the form of a ring, the anti-vibration properties of the capacitors and the power modules themselves can be enhanced. Input current can be applied to the reflux busbars arranged in the form of a ring, and input terminals can be arranged as desired.

Modification 1 of Embodiment 2

A modification of the connection structure of the power modules and capacitors according to the invention is described with reference to FIGS. 9 and 10.

Figure 9:
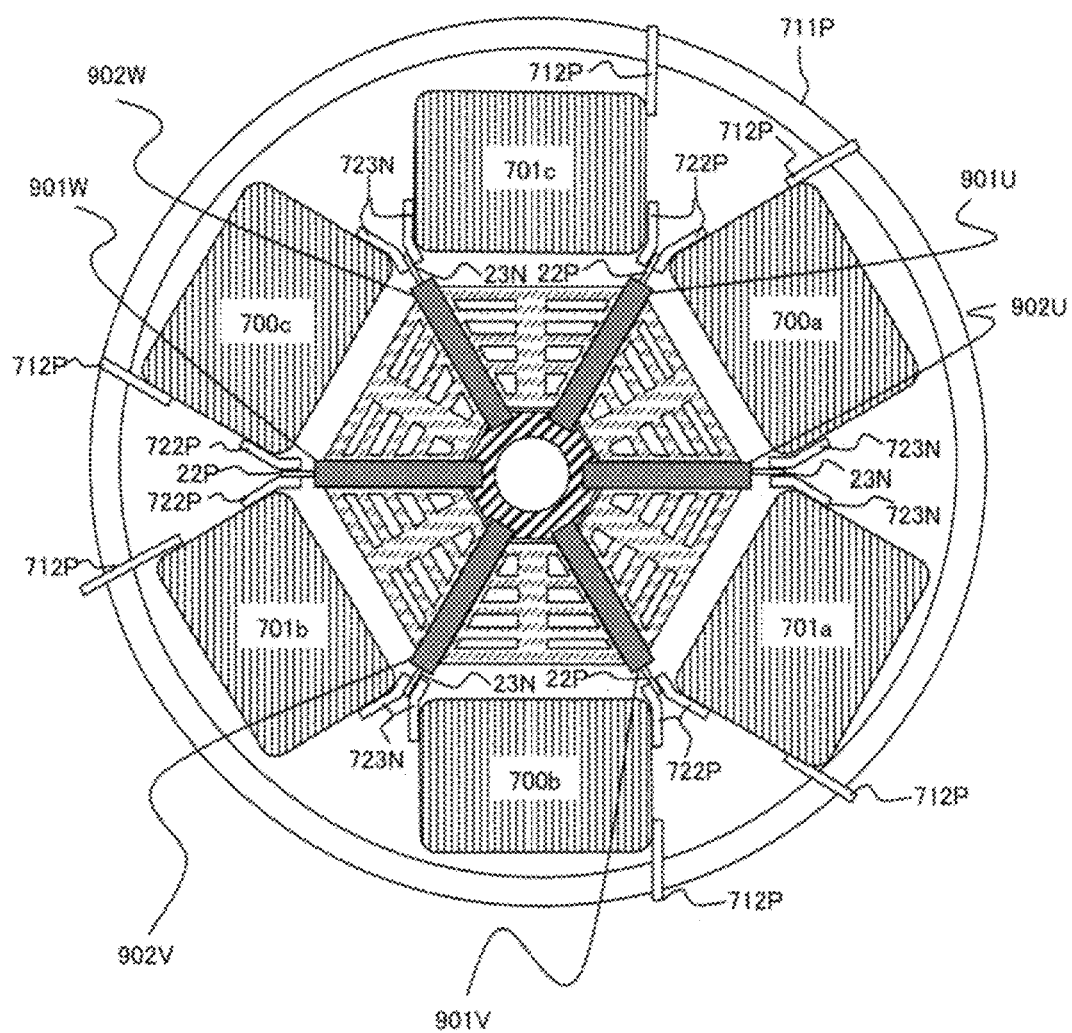
FIG. 9 is a schematic cross section of power modules and capacitors according to an example of the invention.
Figure 10:
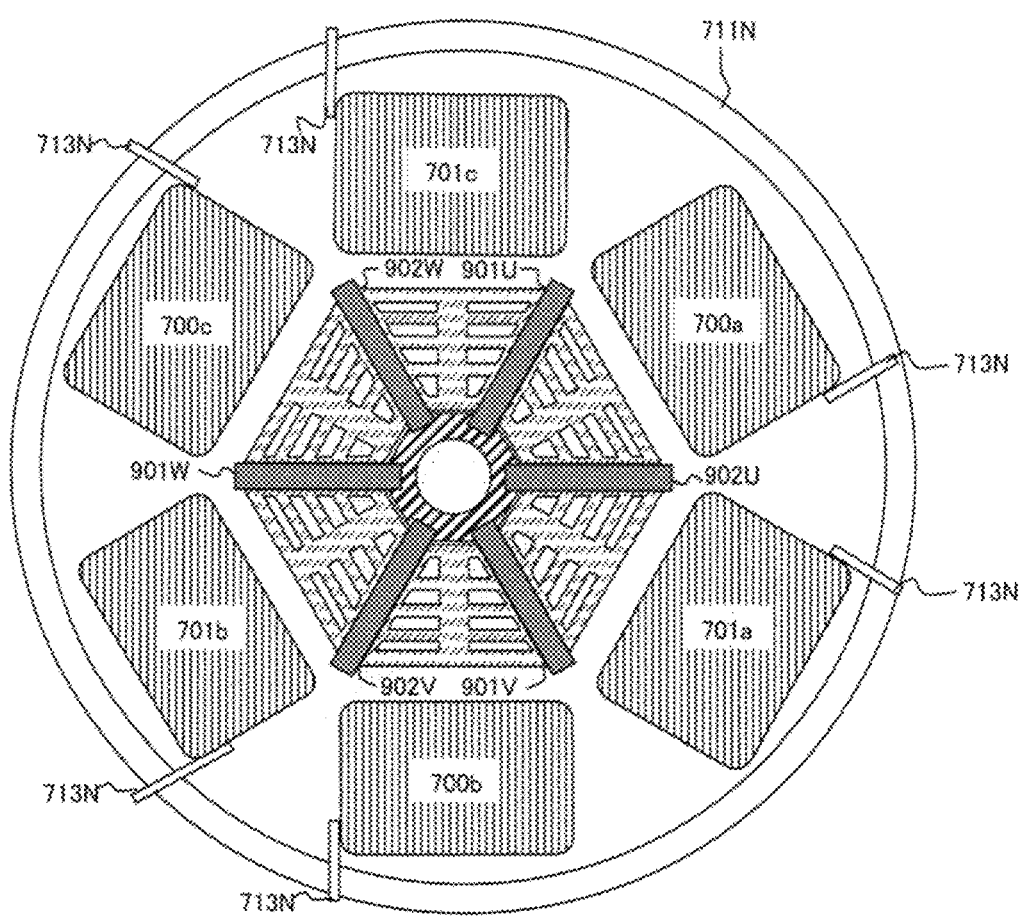
FIG. 10 is a schematic cross section of power modules and capacitors according to a modification of the invention.

The modification of FIG. 9 is different in that, in addition to the capacitors 700a to 700c, capacitors 701a to 701c are provided. The positive terminal 722P of the capacitor 701a is connected to the positive terminal 22P terminal of the power module 901V constituting the V phase and the negative terminal 723N of the capacitor 701a is connected to the negative terminal 23N terminal of the power module 902U constituting the U phase on the inner circumferential side with the necessary insulation distance secured. The positive terminal 722P of the capacitor 701b is connected to the positive terminal 22P terminal of the power module 901W constituting the W phase, the negative terminal 723N of the capacitor 701b is connected to the negative terminal 23N terminal of the power module 902V constituting the V phase, the positive terminal 722P of the capacitor 701c is connected to the positive terminal 22P terminal of the power module 901U constituting the U phase, and the negative terminal 723N of the capacitor 701c is connected to the negative terminal 23N terminal of the power module 902W constituting the W phase on the inner circumferential side with the necessary insulation distance secured.

As illustrated in FIG. 9, the terminals 712P are provided on the outer circumferential side of the capacitors 700a to 700c and 701a to 701c and are electrically connected to the reflux busbar 711P. Also, as illustrated in FIG. 10, the terminals 713N are provided on the outer circumferential side of the capacitors 700a to 700c and 701a to 701c and are electrically connected to the reflux busbar 711N.

By arranging the capacitors 701a to 701c as above, the capacitance of each capacitor can be reduced, leading to a smaller power converter.

Modification 2 of Embodiment 2

A modification of the installation structure of capacitors according to the invention is described with reference to FIG. 11.

Figure 11:
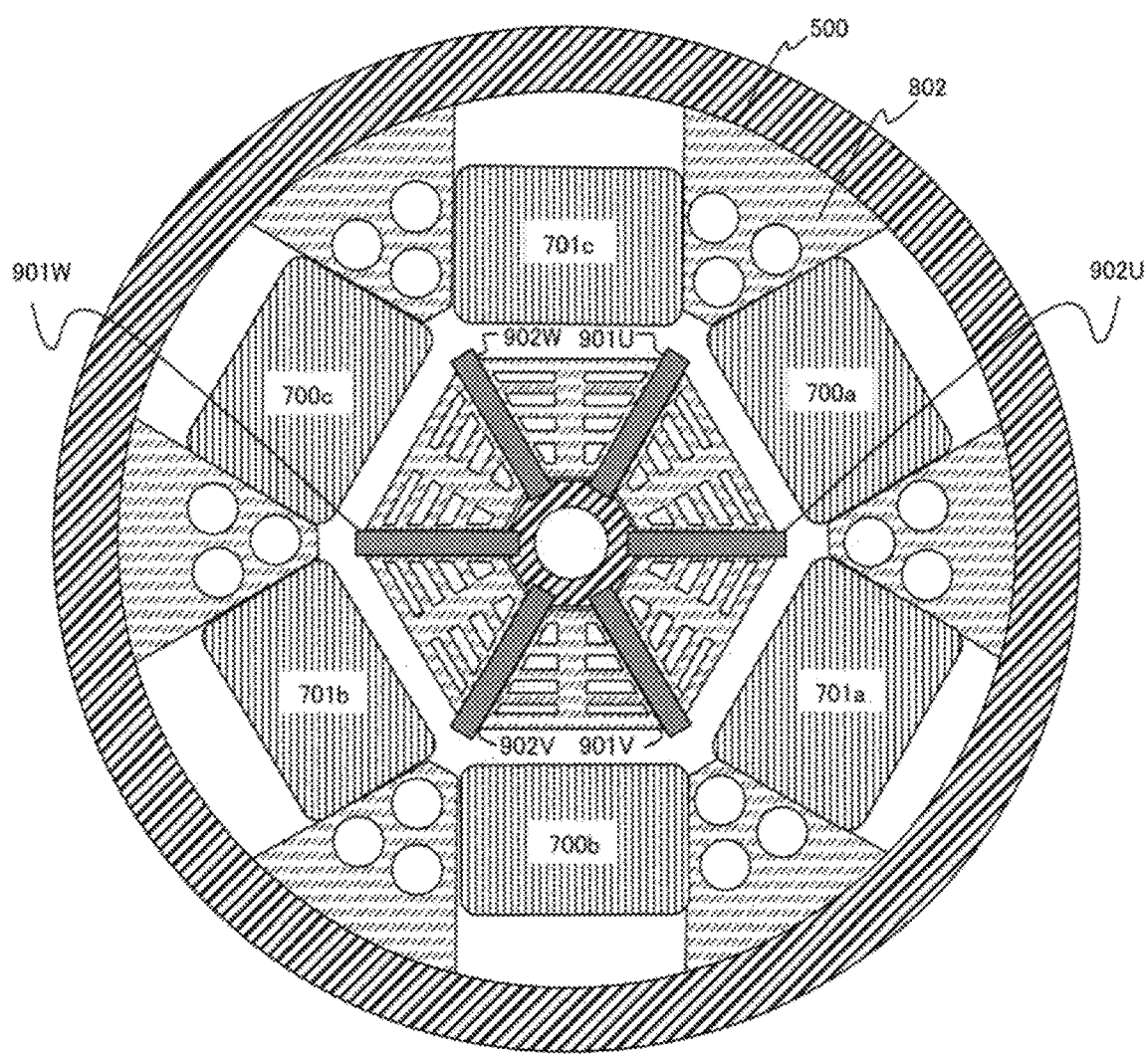
FIG. 11 is a schematic cross section of power modules and capacitors according to a modification of the invention.

The modification of FIG. 11 is different in that water passages 802 are provided between the capacitors 700a to 700c and 701a to 701c. Each of the water passages 802 is trapezoid-shaped or triangle-shaped in cross section, which allows easy installation even at the time of displacement of the capacitors 700a to 700c and 701a to 701c.

The water passages are fastened to a housing 500 at a height different from those of the reflux busbars 711P and 711N. Although, in the present embodiment, the housing 500 and the water passages 802 are discrete units, they can be formed integrally.

By providing the water passages, it is possible to cool the heat generated due to conduction loss of the capacitors or the like, and thus reduce the size of the capacitors and extend their lifespans.

Embodiment 3

An example of the connection structure of the power modules and a motor according to the invention is described with reference to FIGS. 12 and 13.

Figure 12:
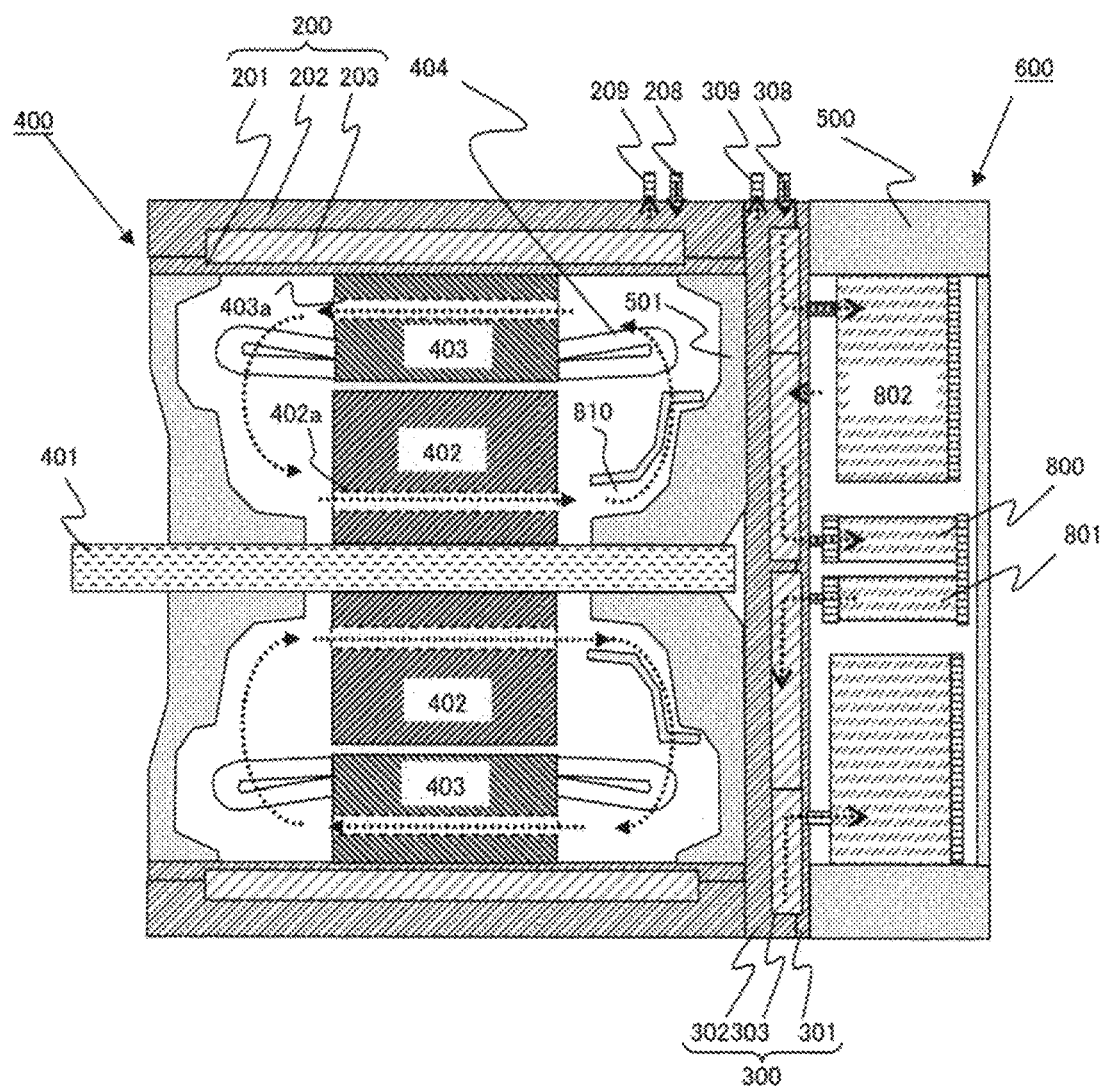
FIG. 12 is a schematic cross section illustrating a water passage route through a power converter and a motor according to a modification of the invention.

FIG. 12 is a cross section illustrating the cooling mode of the connection structure of the power converter using the power modules of the invention and a motor. A power converter 600 is placed next to a motor 400. The drive device of the present embodiment includes an electric rotating machine (motor), a power converter, and water passages provided between the motor and the power converter. The power converter is placed such that an assumed central axis of the power converter runs substantially parallel to the rotary shaft of the motor.

By arranging the power converter and the motor as above, the connection length between the power converter 600 and the motor 400 can be shortened considerably. Thus, fewer components are required, the costs can be reduced, and maintenance is required less frequently. Moreover, electromagnetic noise radiated from motor cables is not generated, and the influence of the noise on electric devices can be prevented.

The motor 400 is housed in a frame 501 in which a rotary shaft 401 and bearings that support it (not illustrated) are provided. A rotor 402 is provided around the rotary shaft 401, and a stator 403 is provided around the rotor via an air gap. The rotor 402 is formed of a rotor core and a shaft. The stator 403 is formed of a stator coil 404 and a stator core (not illustrated), and application of electric current to the stator coil 404 results in formation of a magnetic field. This causes an electromagnetic force in the rotor 402, thereby rotating it. The motor 400 here can be an induction motor or a permanent magnetic motor. In the case of a permanent magnetic motor, a permanent magnet is used in the rotor 402. In the case of an induction motor, electrically conductive members with a high electrical conductivity rate are used.

By applying electric current to the stator coil 404, copper loss is generated in the stator 403. Also, the magnetic field generated by application of electric current to the stator coil 404 causes iron loss in the stator core. Further, the copper loss resulting from eddy current is generated in the rotor 402. The heat generated at those sections in the motor 400 needs to be cooled. Thus, rotor ducts 402a and 403a used for ventilation are provided for the rotor 402 and the stator 403, thereby circulating air in the motor with the use of a fan 810 to perform heat exchange with external air through a frame duct.

To efficiently cool the stator 403, which is lower in heatproof temperature than the rotor, a water passage 200 is provided in the form of a circle. The water passage 200 includes an inner wall 201, an outer wall 202, and a flow path 203. Cooling water is introduced into a joint 208 and discharged from a joint 209. Each joint is provided in a circumferential direction.

Since the stator 403 is cooled by water, the cooling system can be optimized compared with a case where it is cooled by air at the same time as the rotor 402. Also, heat exchange is possible among the cooling air produced by the fan, the housing 200, and the stator 403, and the cooling efficiency of the rotor 402 can be improved. With such a water cooling method, the motor 400 can be reduced in size. Further, it is also possible to adopt an oil-cooling method in which insulating oil is used in place of the cooling fan to cool the rotor. The rotation of the motor causes the insulating oil to cool the rotor 402 and the rotary shaft 401, and by the insulating oil exchanging heat with the housing having the water passages or with the cooled stator, highly efficient cooling is possible. Also, the motor can be reduced in size.

A water passage 300 is provided on the side surface of the power converter 600 to which the motor 400 is attached. Because the housing of the power converter 600 on the lateral side of the motor 400 is cooled by the water passage, it is possible to enhance the cooling efficiency of the frame 501 in which the rotary shaft 401 of the motor 400 and the bearings that support it (not illustrated) are provided. With the highly efficient cooling, the motor 400 can be reduced in size.

The water passage 300 provided between the power converter and the motor includes an inner wall 301, an outer wall 302, and a flow path 303. The water passage 300 connects the water passage provided in the power converter and the water passage provided in the electric rotating machine such that cooling water flows from the water passage provided in the power converter to the water passage provided in the electric rotating machine. The cooling water is introduced into a joint 308, flows through the water passages 800 and 801 that cools the power modules and the water passage 802 that cools the capacitor, and is eventually discharged from a joint 309. It is preferred that the cooling water flow in increasing order of heatproof temperature. That is, it is preferred that the capacitor, power modules, and motor be cooled in the stated order. Thus, in the present embodiment, the cooling water is introduced into 308, flows through the joints 309 and 208, and is discharged from the joint 209. Also, it is preferred that the water passage in the power module section run from the passage 800 that cools the collector side and to the passage 801 that cools the emitter side. At this time, by installing each joint between two adjacent water passages 800 and 801, the joint sections of the water passages 800 and 801 can be made smaller in size without interference with each other than by installing it between two water passages 800 and 801 in a symmetrical surface direction.

Figure 13:
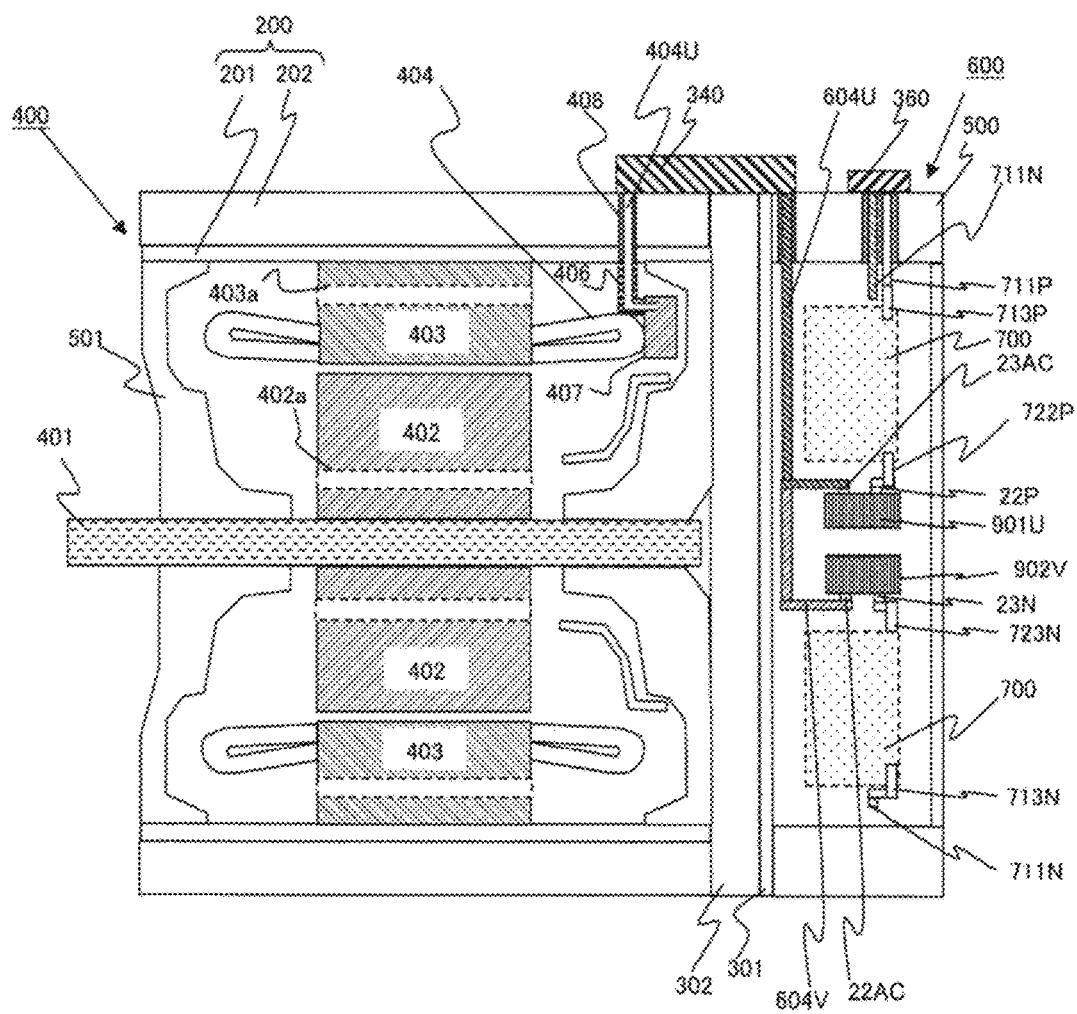
FIG. 13 is a schematic cross section illustrating a current route through a power converter and a motor according to an example of the invention.

FIG. 13 is a cross section illustrating the electricity route of the connection structure of the power converter using the power modules of the invention and a motor. The stator coil 404 has the U, V and W phases. The input terminal 404U of the motor 400 is drawn out from the stator coil 404 corresponding to the U phase in a circumferential direction. Also, input terminals 404V and 404W are drawn out from the stator coils 404 corresponding to the V and W phases in a depth direction of the drawing plane. The input terminals 404U, 404V, and 404W are insulated from the inter-terminal sections and the housing via an insulating material 407 in the stator coil drawing section, via an insulating material 406 in the motor, and via an insulating material 408 in the housing 200.

The AC terminal 23AC of the power module 901U corresponding to the U phase of the power converter 600 is electrically connected to the AC terminal 22AC of the power module 902U via an output terminal 604U and drawn out via an insulating material in a ceiling direction with respect to the housing 500. Likewise, from the power modules 901V, 902V, 901W, and 902W corresponding to the V and W phases, output terminals 604V and 604W are drawn in a ceiling direction. Also, the reflux busbars 711P and 712N are drawn via an insulating material in a ceiling direction.

The output terminals 604U, 604V, and 604W of the power converter 600 are connected to the input terminals 404U, 404V, and 404W of the motor 400 in a connector 340. The busbars 711P and 712 of the power converter 600 are connected to a power supply via a connector 360.

Also since the water passages and electricity input and output units are placed in a direction, installation is easy and maintenance space can be made smaller. Since the same cooling water passage is used for the power converter 600 and the motor 400, the entire drive device can be reduced in size. Especially, when the power converter is installed on a side surface of the motor, mechanical components such as gears are installed on the side surface of the motor, and by installing the water passages and the electricity input and output units on an upper section, space can be minimized.

Modification of Embodiment 3

Figure 14:
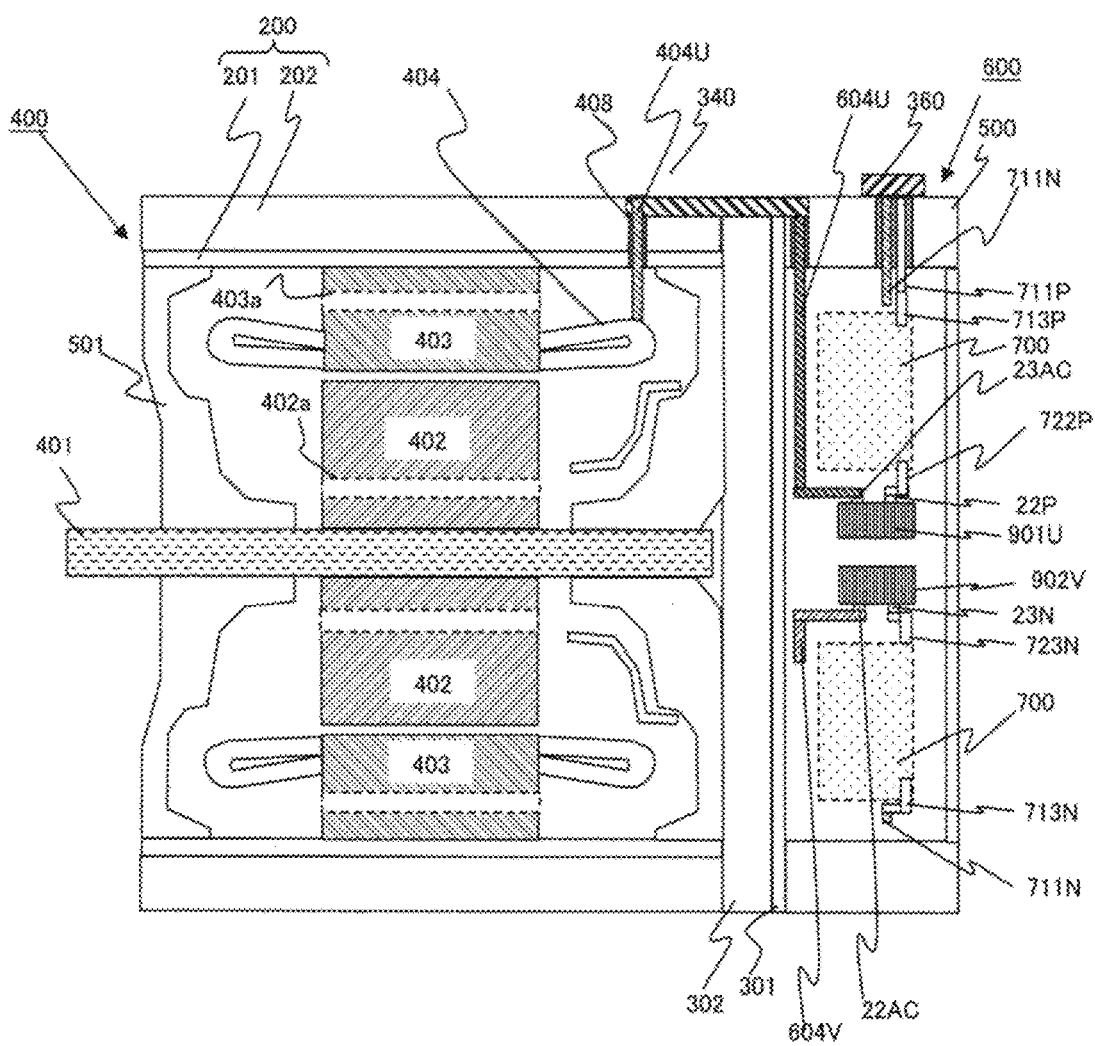
FIG. 14 is a schematic cross section illustrating a current route through a power converter and a motor according to a modification of the invention.

A modification of the connection structure of the power modules according to the invention and a motor is described with reference to FIG. 14.

A difference exists in the electrical connection structure of the input terminals 404U, 404V, and 404W of the motor 400 and the output terminals 604U, 604V, and 604W of the power converter 600. The input terminal 404U is drawn in an outer circumferential direction (side surface of the motor) from the region formed by the U phase in the circumference of the stator coil and electrically connected to the output terminal 404U of the power converter 600 via a connector 340U. The input terminals 404V and 404W are also drawn from the regions formed by their respective phase to a side surface of the motor and electrically connected to the output terminals 404V and 404W of the power converter 600 via connectors 340V and 340W.

By adopting a structure in which the input terminals are drawn for their respective phases, it becomes easy to lead the input terminals in the circumference of the stator coil. Members for insulating the inter-terminal sections are not necessary in the drawing-out region, which facilitates assembly and enhances reliability. Also, based on the number of motor poles, the number of parallel power modules 901 and 902 can be increased. With such an increase, the wiring distances between the input terminals 404U, 404V, and 404W of the motor 400 and the output terminals 604U, 604V, 604W of the power converter 600 can be made shortest.

It also becomes unnecessary to use materials for insulating inter-terminal sections of the connector section, and it can be reduced in size. Further, the connection section can be housed in the housing 200 or 500, leading to a smaller size.

The connection length can be shortened for each phase, and conduction loss can be reduced, resulting in improved efficiency. Further, since the uniformity in wiring length among the phases can be increased, the electric current balance can be improved. Especially in the case of delta connection, with the increased current balance, the circulating current that occurs among the phases can be prevented, leading to reduced conduction loss and improved efficiency.

In the present embodiment, water passages are used as the coolers 800 and 801 that are smallest possible in volume and capable of cooling the power modules. In place of those, air-cooling fins can also be used. In that case, it is preferred to install the air-cooling fins at a high section outside the housing in place of a heat sink that includes a heat pipe for the regions corresponding to the water passages.

While we have described some embodiments of the invention, it should be noted that the invention is not limited thereto but allows various modifications without departing the spirit of the invention disclosed in the appended claims. The embodiments we have described are intended for illustration purposes only, and the invention is not limited to embodiments that include all the components described above. Thus, some components of an embodiment can be removed or replaced with some components of another.

DESCRIPTION OF REFERENCE CHARACTERS

10: First insulating material
11: Metal bonding section
12: Ceramic substrate
13: Ceramic substrate
101: IGBT
102: Diode
20: Gate drive circuit
21: Gate terminal
22: Emitter terminal
23: Collector terminal
24: Intermediate terminal
25: Sense emitter terminal
121: Emitter circuit
131: Collector circuit
122: Ceramic insulating layer
132: Ceramic insulating layer
42: Radiating surface
43: Radiating surface
123: Metalized layer
133: Metalized layer
602: Second insulating material
124: Thermally conductive sheet
134: Thermally conductive sheet
400: Motor
401: Rotary shaft
402: Rotor
403: Stator
404: Stator coil
500: Housing
600: Power supply
700: Capacitor
800: Water passage
801: Water passage
802: Water passage
600: Power converter
901: Power module
902: Power module

The invention claimed is:

1. A power converter comprising:
a plurality of water passages arranged radially from an assumed central axis, each being trapezoid-shaped in cross section; and
power modules placed between the water passages such that each of the power modules are sandwiched from both surfaces thereof by the water passages, wherein
each of the power modules have an output terminal and positive and negative terminals on an end face located in a centrifugal direction side with respect to the assumed central axis, and
any of the power modules and an adjacent one of the power modules are set in a front-back inverted manner.

2. The power converter according to claim 1, wherein the end faces of the power modules located in a centrifugal direction side with respect to the assumed central axis protrude more than the water passages in a centrifugal direction.

3. The power converter according to claim 1, wherein the positive and negative terminals and the output terminals are provided in regions in which they do not interfere with each other.

4. The power converter according to claim 1, wherein
the end faces of the power modules located in a centrifugal direction side with respect to the assumed central axis protrude more than the water passages in a centrifugal direction, and
the positive and negative terminals and the output terminals are provided in regions in which they do not interfere with each other.

5. The power converter according claim 1 further comprising a position setting section that engages with the power modules.

6. The power converter according to claim 1, wherein
each of the water passages includes a water inlet provided on a collector circuit side of the power modules and a water outlet provided on an emitter circuit side of the power modules, and
cooling water flows from the collector circuit side to the emitter circuit side.

7. The power converter according to claim 1, further comprising a plurality of capacitors arranged radially from the assumed central axis such that the capacitors are placed adjacent to the water passages.

8. The power converter according to claim 7, further comprising, on an outer side of the plurality of capacitors, a busbar for electrically connecting the plurality of capacitors.

9. The power converter according to claim 7, wherein coolers are provided between the plurality of capacitors.

10. The power converter according to claim 7 wherein if six power modules are provided, the number of the capacitors provided is three or six.

11. A drive device comprising:
an electric rotating machine;
the power converter of claim 1; and
a second water passage placed between the electric rotating machine and the power converter, wherein
the power converter is placed such that the assumed central axis runs substantially parallel to a rotary shaft of the electric rotating machine.

12. The drive device according to claim 11, wherein the second water passage connects the plurality of water passages provided in the power converter to a third water passage provided in the electric rotating machine such that cooling water flows from the plurality of water passages to the third water passage.

13. The drive device according to claim 11, wherein the input terminals of the electric rotating machine are drawn for each phase to be connected to the output terminals of the power converter.

* * * * *